(12) United States Patent
Barth, Jr. et al.

(10) Patent No.: US 7,085,971 B2
(45) Date of Patent: Aug. 1, 2006

(54) ECC BASED SYSTEM AND METHOD FOR REPAIRING FAILED MEMORY ELEMENTS

(75) Inventors: John E. Barth, Jr., Williston, VT (US); Wayne F. Ellis, Jericho, VT (US); John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 10/035,474

(22) Filed: Oct. 25, 2001

(65) Prior Publication Data
US 2003/0084386 A1 May 1, 2003

(51) Int. Cl.
*G11C 29/00* (2006.01)

(52) U.S. Cl. .................. 714/710; 714/30; 714/718; 714/764; 365/200; 365/225.6

(58) Field of Classification Search .............. 714/733, 714/710, 30, 711, 702, 723, 746; 365/200
See application file for complete search history.

(56) References Cited

U.S. PATENT DOCUMENTS

| | | | | |
|---|---|---|---|---|
| 4,918,692 A | * | 4/1990 | Hidaka et al. | ............. 714/702 |
| 4,939,694 A | * | 7/1990 | Eaton et al. | ................. 365/200 |
| 5,278,839 A | * | 1/1994 | Matsumoto et al. | ........ 714/710 |
| 5,548,555 A | | 8/1996 | Lee et al. | |
| 5,577,050 A | | 11/1996 | Bair et al. | |
| 5,745,500 A | | 4/1998 | Damarla et al. | |
| 5,748,543 A | * | 5/1998 | Lee et al. | ................... 365/200 |
| 5,764,878 A | | 6/1998 | Kablanian et al. | |
| 5,910,921 A | | 6/1999 | Beffa et al. | |
| 5,920,515 A | | 7/1999 | Shaik et al. | |
| 5,987,632 A | * | 11/1999 | Irrinki et al. | ............... 714/711 |
| 6,067,262 A | | 5/2000 | Irrinki et al. | |
| 6,081,910 A | | 6/2000 | Mifsud et al. | |
| 6,119,251 A | | 9/2000 | Cloud et al. | |
| 6,304,989 B1 | * | 10/2001 | Kraus et al. | ................. 714/733 |
| 6,320,800 B1 | * | 11/2001 | Saito et al. | ................. 365/200 |
| 6,415,403 B1 | * | 7/2002 | Huang et al. | ............... 714/726 |
| 6,442,083 B1 | * | 8/2002 | Hotaka | ........................ 365/200 |
| 6,505,313 B1 | * | 1/2003 | Phan et al. | .................. 714/718 |
| 6,519,735 B1 | * | 2/2003 | Holman et al. | ............. 714/763 |
| 6,532,181 B1 | * | 3/2003 | Saito et al. | .................. 365/200 |
| 6,560,740 B1 | * | 5/2003 | Zuraski et al. | ............. 714/733 |
| 6,691,252 B1 | * | 2/2004 | Hughes et al. | ................. 714/30 |
| 6,697,290 B1 | * | 2/2004 | Beucler et al. | ............. 365/200 |

* cited by examiner

*Primary Examiner*—Guy Lamarre
*Assistant Examiner*—John Trimmings
(74) *Attorney, Agent, or Firm*—Daryl K. Neff; H. Daniel Schnurmann

(57) ABSTRACT

An ECC based system and method within an integrated circuit memory for self-repair of a failed memory element is disclosed. The method includes processing, within the integrated circuit, data and check bits retrieved from addressed memory locations therein. The locations of memory failures are automatically recorded within the integrated circuit. Logic circuits within the integrated circuit automatically identify failure patterns based on the locations. Based on the identified failure patterns, logic circuits within the integrated circuit then permanently replace a failed memory element with an appropriate redundancy element, using devices such as electronic fuse or antifuse. In this manner, the integrated circuit automatically identifies and effects self repair of a failed memory element therein.

10 Claims, 3 Drawing Sheets

ECC enabled Array Block diagram

Defect Density vs. Defect Size

Array Block diagram

ECC enabled Array Block diagram

ECC BASED SYSTEM AND METHOD FOR REPAIRING FAILED MEMORY ELEMENTS

FIELD OF THE INVENTION

The present invention relates to dynamic random access memories (DRAMs) including DRAMs embedded in multi-purpose integrated circuits. More specifically, the invention relates to a system and method for repairing a failed memory element.

BACKGROUND OF THE INVENTION

Recently, designers of ASICs (Application Specific Integrated Circuits) have expressed interest in incorporating DRAM macros to enhance on-chip storage density. Greater processing widths and speed available now to ASICs is beginning to demand storage densities which stretch the limits of static random access memory (SRAM), which has traditionally been embedded in those ASICs which include a processor element such as a microprocessor.

Owing to their diverse circuit implementations and design goals, production verification testing of ASICs and DRAMs has differed widely. Traditional ASICs, having mainly logic circuits such as for a microprocessor and SRAM elements, are production tested in only a few minutes, because failures are manifested by relatively large defect currents (from several to several hundred microamps (>1×10E-6), which are manifested either before or after very short durations of high stress testing. On the other hand, it may take tens of hours of burn-in testing to manifest all early life failures within a DRAM because of much smaller tolerances for defect currents, which typically measure in sub-picoamps (<1×10E-12). Moreover, since DRAMs typically have greater integration density than logic circuits, the defect density is greater. As illustrated in FIG. 1, it has been noted that the defect density (the number of defects within a given volume) in an integrated circuit lies in inverse relation to the cube of the size of the defective element. For example, assuming an element size in a DRAM which is one half the element size used in a microprocessor, the defect density of the DRAM is expected to be more than eight times the defect density of the microprocessor.

Thus, when a DRAM macro is embedded into an ASIC, a problem is presented for production verifying the completed integrated circuit. If traditional ASIC test methods are used which are short in duration but at high stress, many marginal DRAM memory elements will not be identified at time of test. Instead, such marginal DRAM elements will only fail later once the ASIC is packaged and used in the final product by the end user. However, if traditional DRAM test methods are used which have long duration, this poses a major disruption to standard ASIC test and reliability screening processes.

Table 1 below indicates failure modes for elements within a DRAM, and the frequencies with which they are manifested through burn-in testing of each integrated circuit.

TABLE 1

| Array Failure | Frequency | Root Cause | No. of Lost Bits |
| --- | --- | --- | --- |
| Single cell failure | 98% | Crystal defect Oxide defect | 1 |
| Paired cell failure | 1% | Contact defect | 2 |
| Wordline x Bitline | <1% | Contact-WL short | >2 |

TABLE 1-continued

| Array Failure | Frequency | Root Cause | No. of Lost Bits |
| --- | --- | --- | --- |
| Partial bitline or Partial wordline failure | <1% | Open metal | >2 |
| Full bitline or Full wordline failure | <<1% | miscellaneous | 256 to 4096 bits |

It is apparent from the above and Table 1 that ASICs which incorporate a DRAM will perform poorly unless provision is made for the DRAM early life failures. From Table 1, it is apparent that the majority of early life failures affects a single bit memory cell. However, a significant amount of early life failures affect multiple memory cells such as partial or full bitline or wordline failures. Since currently practiced long duration DRAM testing is undesirable with present ASICs testing, an alternative approach is needed for handling DRAM early life failures while meeting reliability goals in the final product.

FIG. 2 is a block diagram illustrating the structure and operation of a conventional DRAM, and is provided and described here as background to the present invention. A DRAM may be "standalone", i.e. the only circuitry on an integrated circuit, or it may be "embedded", i.e. incorporated as a memory along with a logic core or microprocessor on integrated circuits such as ASICs. As shown in FIG. 2, a DRAM typically includes a number of banks, shown here as Bank<0:3>. Each bank contains an array of DRAM memory cells 201, each memory cell which lies at the intersection between a wordline 203 and a bitline 205. By way of example, read access to a memory cell 201 is performed in the following manner. Address (ADDR), and commands for bank select, row command (Row Cmd) and column command (Col Cmd) are presented to a row control unit (Row Cntl 207) and column control unit (Col Cntl 209). From these signals, row decoder (Row Dec. 211) selects and activates a wordline 203. The activated wordline 203 causes information stored in all memory cells coupled to that wordline 203 to be placed on respective bitlines, including the information from memory cell 201 which is placed on bitline 205. The retrieved information from the memory cells are then transferred to sense amplifiers 213, but in typical DRAMs only a fraction, e.g. one fourth, of the bits accessed by the wordline 203 are selected and output onto a databus DQ 217 by column decoders 215, column selection being based on the column address portion of the address ADDR.

SUMMARY OF THE INVENTION

Accordingly, in the present invention, a word including data bits and check bits are stored in addressed locations of a memory within an integrated circuit. Preferably, the memory is a DRAM, but the invention could also be implemented for another memory type such as SRAM and/or electrically erasable programmable read only memory (EEPROM), including flash memory. On read access, the data bits and check bits are retrieved and processed to verify the retrieved data bits, and to detect and/or correct any bit errors therein. The verified data bits are then output onto a data bus within the ASIC. When a single bit correction, double error detection code (SEC/DED) is used, errors due to single cell failures are corrected. Therefore, the on-board error correction capability within the integrated circuit memory fully corrects for single cell failures, in almost all cases.

However, since other failure modes may appear within the memory, the data and check bits are further processed within the integrated circuit, as by reference to the error correction code (ECC) syndrome string for the retrieved bits, to determine the locations of memory failures. At this stage of processing, the locations of memory failures are automatically identified and recorded in terms of bit location within the array, identified by row address, syndrome string, and column address information as needed.

At some appropriate time, which can be ongoing during operation, or scheduled upon a power-down or power-up sequence, failure patterns are automatically identified by first logic circuits based on the recorded locations. Examples of failure patterns include partial or full wordline failure and full or partial bitline failure. Based on the identified failure patterns, logic circuits within the integrated circuit then automatically replace one or more failed memory elements, e.g. single cell failures, full or partial wordline failures, full or partial bitline failures, etc., with redundancy elements such as partial or full wordline redundacny, and partial or full bitline redundancy, among others.

DETAILED DESCRIPTION OF THE PREFERRED EMBODIMENTS

Figure 3:
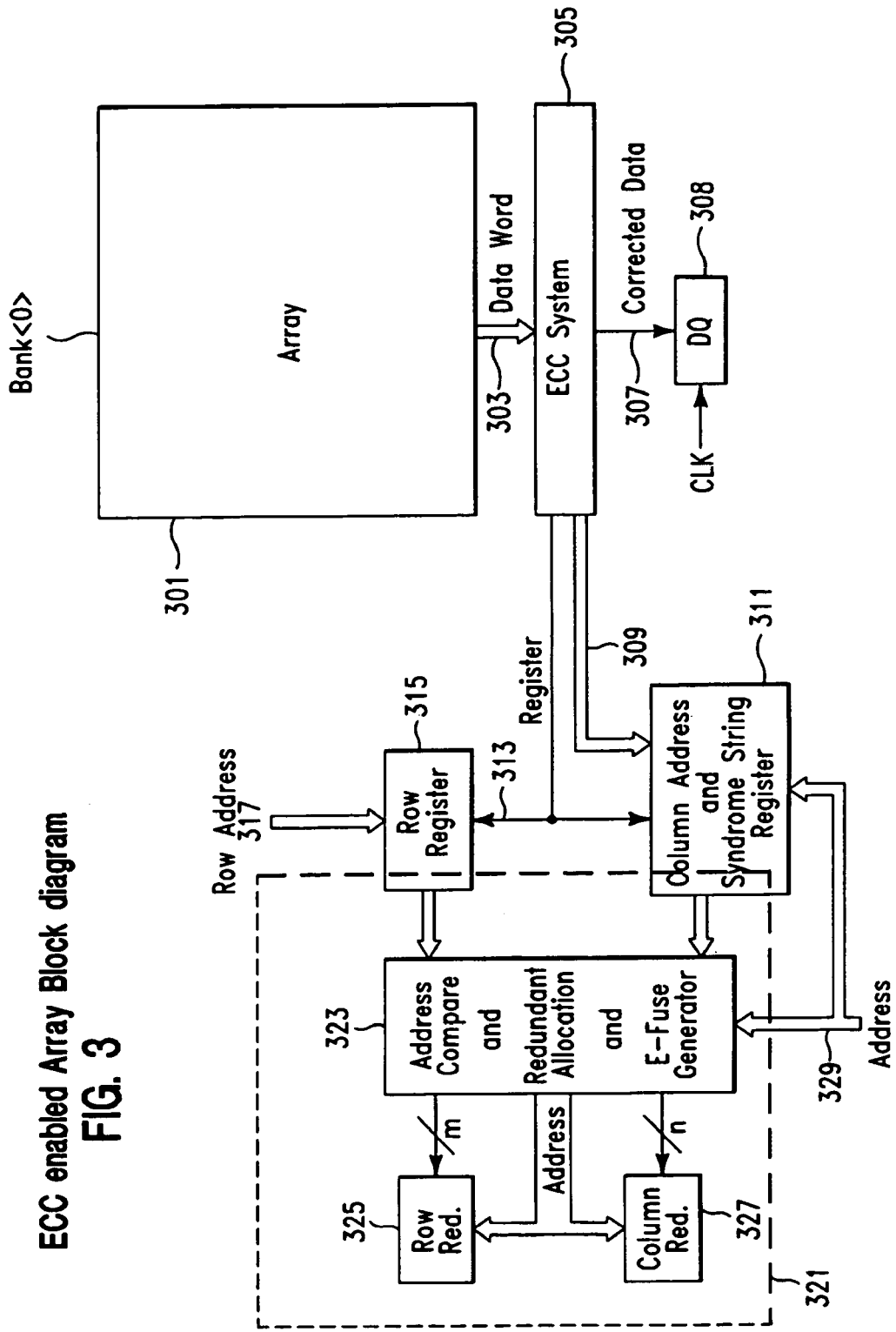
FIG. 3 is a block diagram illustrating structure and operation according to a preferred embodiment of the present invention.

FIG. 3 illustrates a preferred arrangement for implementing the present invention in the context of a DRAM, although the invention could be implemented with another memory type such as SRAM or EEPROM. As shown in FIG. 3, a DRAM, either standalone or preferably embedded within an ASIC, includes a Bank<0> of memory cells arranged within an array 301.

Figure 2:
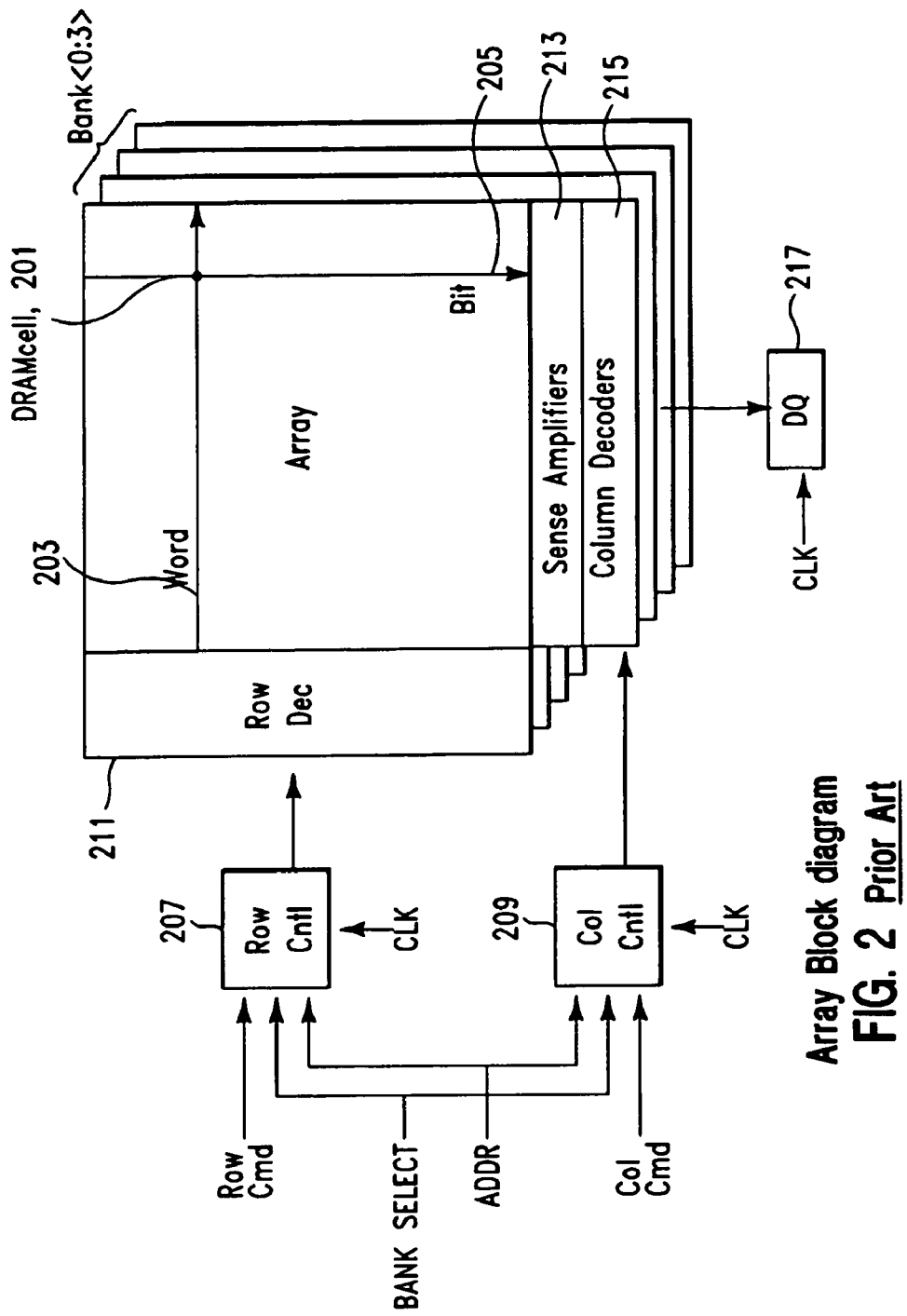
FIG. 2 is a prior art block diagram illustrating the structure and operation of a DRAM.

Memory cells within array 301 are accessed by an address and commands in the manner described above relative to FIG. 2. Circuitry which selects row, column, and bank, as well as associated control circuitry and sense amplifiers are not shown in FIG. 3 but are understood to be present, as described above relative to FIG. 2. During a read operation, retrieved information from a row or partial row of memory cells in array 301 is output from sense amplifiers (not shown) associated with Bank<0> as a data word 303 to an ECC system 305. Typically, a row of memory cells is accessed by a wordline using a row address. A plurality of data words 303 are stored within the row. For example, a row which stores 512 data bits can contain four data words 303, each having 128 data bits. In such case, two bits of the column address are needed to uniquely identify which of the four data words 303 is to be accessed from the row.

The ECC system 305 includes circuits which process a set of data bits and check bits within the data word 303 to output a verified or corrected data string 307 to data bus DQ 308. The ECC system also outputs a syndrome string 309 to a column address and syndrome string register 311, which register 311 is intended to be understood broadly as being of any type suitable for short term storage such as a buffer, cache or address range within a RAM, without limitation. As indicated above, the error correction code (ECC) preferably enables single bit correction, double error detection (SEC/DED), and the invention will be further described in relation thereto. An example of an on-chip ECC system which provides for SEC/DED correction is described in U.S. Pat. No. 2,571,317. DRAMs embedded into ASICs typically employ wide data paths of 128 bits or greater. The actual overhead in terms of number of check bits per data bits to implement SEC/DED correction decreases as the data path is designed to be wider. For example, it takes 8 check bits to implement SEC/DED on a 64 bit data path for a data word 303 of 72 bits in total width. However, when the data path is increased to 128 bit data width, only 9 check bits are needed for SEC/DED for a data word 303 of 137 bits in total width.

When only a single bit error is present, the syndrome string 309 indicates the precise bit position of the error within the data word 303. When the row of the array 301 contains only one data word 303, the row address 317 and the syndrome string 309 uniquely identify the location of a memory failure within the array 301 which affects at least one memory cell. However, as described above, for a memory in which four data words 303 are stored in a row, two column address bits are needed to identify the particular data word 303 within the row. Therefore, for a general case in which a plurality of data words 303 are stored in each row, the row address 317, the syndrome string 309 and some portion of the column address are needed to uniquely identify the location of a memory failure within array 301. This embodiment will be further described in relation to such general case.

When more than one bit error is present, for example, two bit errors, the syndrome string 309 for such SEC/DED ECC sometimes correctly indicates the position of the errors within the data word, but more often only indicates that the data word is flawed, but not otherwise correctable. In case of either a single bit error or multiple bit errors in data word 303, an error flag 313 is output from ECC system 305 to row register 315, in response to which row register 315 records the current row address 317. The error flag 313 is also output to column address and syndrome string register 311, in response to which the current syndrome string 309 and column address information is stored in register 311, thus identifying the location of a memory failure within the array 301. The recorded location identifies a memory failure which affects at least one memory cell.

Figure 1:
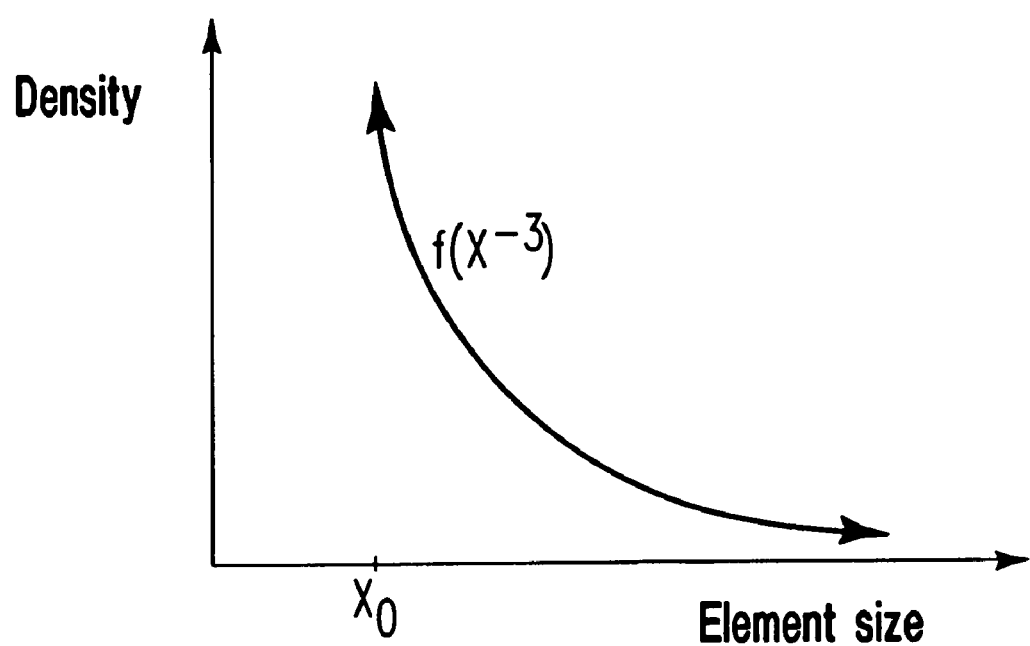
FIG. 1 shows a plot of defect density versus defect size characteristic of an integrated circuit memory such as a DRAM.

Repair system 321 includes control block 323, a block 325 of row redundancy elements and a block 327 of column redundancy elements. A primary function of the repair system 321 is to provide alternate storage locations when a single memory cell or larger memory elements such as partial or full bitline, partial or full wordline, are identified as failed. The existence of such alternate storage locations and the method of access thereto are unknown to the entity, e.g. microprocessor element of the ASIC, that requests storage access. Thus, the control block 323 operates upon an incoming address 329 to steer access to a row redundancy element or to a column redundancy element of blocks 325, 327 after a failed row element or column element of array 301 has been replaced with the row or column redundancy element. When a particular row or column element of array 301 has not failed, memory access is provided from array 301 in usual manner rather than to row or column redundancy elements of blocks 325, 327, It will be understood that address 329 is also provided to row decoder and column decoder (shown, for example in FIG. 1) associated with array 301, and additional circuitry (also not shown) will be present which selects either the output of array 301 or of a row or column redundancy element of blocks 325, 327 as input to ECC system 305, depending upon the status of an address as reflected in control block 323. It will be understood that row redundancy elements of block 325 and column redundancy elements of block 327 can be located within one or more redundancy arrays on the integrated circuit which are separately located from array 301. Alternatively, such row and column redundancy elements of blocks 325, 327 can be incorporated as normally unused elements of array 301, put in use only after redundancy replacement is made.

Control block 323 also has the function of allocating individual row and/or column redundancy elements from blocks 325, 327 to replace failed memory elements such as row or column elements within array 301. Control block 323 generates signals which electrically alter circuit connections, as by electronic fuses or antifuses, for example, to permanently steer access to certain row and/or column redundancy elements within blocks 325, 327 when the incoming address 329 points to a failed row element and/or column element of array 301. A exemplary description of electronic fuses and operation is described in co-owned U.S. patent application Ser. No. 09/466,479 filed Dec. 17, 1999 entitled "Methods and Apparatus for Blowing and Sensing Antifuses", having IBM Docket No. BUR9-1999-0038US1. Electronic fuses and/or antifuses which are permanently altered by control block 323 cause row or column redundancy elements within blocks 325 or 327 to be accessed in place of failing row or column elements within array 301 upon receipt of certain addresses which point to the failing elements within array 301.

Control block 323 further receives the following inputs: a row address retrieved from row address register 315, and the syndrome string 309 and column address information retrieved from register 311. As will be described more fully below, the row address, the syndrome string and column address information are inputs to a failure identification process which uses these inputs to identify failure patterns and determine the address of one or more failed partial or full row or column elements within array 301 which are candidates for replacement by redundancy elements. The process, which may be implemented, for example, in hard-coded form, e.g. state machine, or as a programmed process, may be designed to execute within control block 323 or, alternatively, within one or more processor elements within the same integrated circuit which have an input/output connection to control block 323. Preferably, the failure identification process forms a part of a built-in-self-test (BIST) feature of the integrated circuit. Based on the identified failure patterns, a redundancy allocation process of control block 323 allocates a row or column redundancy element from blocks 325 and 327 in place of a failed memory element of array 301. Continuing the redundancy allocation process, control block 323 generates signals, which are used to electrically alter certain circuit connections, as by electronic fuse or antifuse. Future memory access to the failed memory element is then provided to a row or column redundancy element within blocks 325 or 327 in place of the originally accessed row or column element within array 301.

In a first preferred embodiment, the failure identification and redundancy allocation processes operate during a normal operational mode of the integrated circuit. In such case, the integrated circuit services requests in normal manner except as to memory access requests to the particular memory bank<0> in which the failure identification and redundancy allocation processed is being performed at the time. In such case, one or more control signals can be asserted as a busy signal on a handshaking bus or master bus or as signals to logic elements of the integrated circuit, such as an ASIC processor. In this manner, memory access requests made to the integrated circuit by other system level elements would not be dropped, which could lead to a system level fault.

In another preferred embodiment, the failure identification and redundancy allocation processes operate during a power-down sequence or during a power-up sequence, or both. Such processes could be triggered by available processor commands for power-down or power-up operation, and be completed at a time when memory availability is not required. Such power-down and power-up sequences may be triggered as part of the system's energy saving modes of operation. Since the failure identification and redundancy allocation processes are normally expected to involve only several microseconds delay, they would not be noticeable to the system end-user.

The operation of a preferred embodiment will now be described, again relative to FIG. 3. An integrated circuit incorporating a DRAM according to the preferred embodiment can be production tested using only a short duration burn-in process such as that which is common for logic or processor ASICs. After such testing, the DRAM would be expected to retain a number of memory failures which are possibly unidentified. Memory access to the DRAM is provided on a bank by bank basis, as illustrated in FIG. 3. Within a bank, e.g. Bank<0>, a data word 303 containing both data bits and check bits is output as a data word 303 to ECC system 305. Based on data word 303, the ECC system 305 verifies and/or corrects the data bits and outputs them as a corrected data string 307 to a DQ bus 308, which then transfers the data bits to a requesting element of the integrated circuit such as a processor. By use of a SEC/DED ECC, single bit errors are corrected, such that the vast majority of single memory cell failures are corrected.

The ECC system 305 also outputs a syndrome string 309 to syndrome string register 311 which indicates the bit position of an error when present within data word 303. An error flag 313 is provided to syndrome string register 311 and row register 315 to signal presence of one or more errors, which signals these registers to store the current row address, the syndrome string and column address information, thereby uniquely identifying the location of a memory failure.

At an appropriate point in time, which may be, for example, during a normal operational mode or during a power-up or power-down sequence, the information logged in row register 315 and column address and syndrome string register 311 are used by a failure identification process to identify failure patterns with array 301 of Bank<0>. Failure patterns, such as failures of a partial row or whole row, partial column or whole column are identified by this process. Based on the identified failure patterns, allocation of redundancy elements is made from row and column redundancy blocks 325, 327, and circuit connections are electrically altered by activating elements such as electronic fuse or antifuses, such that access to a failing element of memory array 301 is thereafter made instead to the allocated row redundancy element or column redundancy element.

Among the advantages, when the preferred embodiment of the invention is incorporated into an ASIC, is greater system reliability. The operation of the ECC to fix correctable errors (e.g. single bit errors) and check for multiple bit errors in retrieved data words is a scrubbing process that continues throughout the lifetime of the ASIC. In addition, another improvement to system reliability is seen in the provision on board the ASIC to identify failure patterns, to allocate redundancy elements in response thereto, and to electrically alter circuit connections to replace failed memory elements with redundancy elements, all while the ASIC remains installed normally in a system. Moreover, as ASIC operating temperatures are expected to be 10 to 20 degrees C. hotter than stand alone DRAM ICs, and leakage currents from DRAM memory cells typically double for every ten degrees C. rise, the ECC also enhances the base reliability of the embedded DRAM by scrubbing intermittent failures associated with such leakage currents that appear at high operating temperatures.

Another alternative embodiment of the invention is now described, with reference generally to FIG. 3, but pointing out specific differences thereto. In the alternative embodiment, the data bits portion of data word 303 is transferred directly from array 301 to DQ bus 308, in parallel with the transfer of data word 303 to ECC system 305. In such arrangement, the ECC system 305 provides an enable flag to DQ bus 308 if no error is detected. Final activation of data drivers of DQ bus 308 are then conditioned on receipt of the enable flag. However, when ECC system 305 detects an error, the enable flag is not present. The data drivers are then held in a tri-state mode until the ECC system 305 provides corrected data, the corrected data is reloaded into data latches of DQ bus 308 and the ECC system 305 reactivates the data drivers with the enable flag.

While the invention has been described in relation to certain preferred embodiments thereof, those skilled in the art will recognize the many modifications and enhancements which can be made without departing from the true scope and spirit of the invention, as limited only by the claims appended below.

What is claimed is:

1. A method for identifying a failed memory element within an integrated circuit memory and for repairing said integrated circuit memory, comprising:
   providing an integrated circuit memory having a plurality of banks;
   automatically identifying and recording locations of failures within said integrated circuit memory by storing data bits and error correction code ("ECC") check bits to individual locations of said integrated circuit memory;
   thereafter retrieving data bits and ECC check bits from said individual locations;
   recording at least single-bit failure locations in said integrated circuit memory based on ECC processing said retrieved data bits together with said retrieved ECC check bits;
   based on said recorded failure locations, using first logic circuits within said integrated circuit to automatically identify a failed memory element in one bank of said plurality of banks; and
   asserting a busy signal for said one bank; and
   while asserting said busy signal and servicing at least one of read or write access requests to banks of said plurality of banks other than said one bank, electrically activating fusible elements within said integrated circuit including elements selected from the group consisting of fuses and antifuses, to electrically alter circuit connections of said integrated circuit memory to automatically replace said failed memory element in said one bank with a redundancy element.

2. The method of claim 1 wherein said integrated circuit memory is of the type selected from dynamic random access memory DRAM), static random access memory (SRAM), and electrically erasable programmable read only memory (EEPROM) including flash memory.

3. The method of claim 1 wherein said failed memory element is replaced with a redundancy element selected from the group consisting of at least row redundancy element and column redundancy element.

4. The method of claim 1 wherein said fusible elements are electrically activated when said integrated circuit remains installed within a product for normal use.

5. An integrated circuit including a self-repairing memory having a plurality of banks, comprising:
   a memory;
   error correction code (ECC) logic circuits coupled to said memory, said ECC logic circuits operable to detect errors within strings of data bits and check bits retrieved from addressed storage locations within said memory;
   means for recording locations of at least single-bit failures from said detected errors;
   means for automatically identifying a failed memory element in one of said plurality of banks based on said recorded locations;
   means for asserting a busy signal for said one bank;
   electrically activatable fusible elements including elements selected from the group consisting of fuses and antifuses; and
   means for electrically activating at least some of said fusible elements to electrically alter circuit connections of said memory to automatically replace said failed memory element in said one bank with a redundancy element while said busy signal is asserted; and
   means for permitting at least one of read access or write access to banks of said plurality of banks other than said one bank while said busy signal is asserted.

6. The integrated circuit of claim 5 wherein said memory is of the type selected from dynamic random access memory (DRAM), static random access memory (SRAM), and electrically erasable programmable read only memory (EEPROM) including flash memory.

7. The integrated circuit of claim 5 wherein said means for automatically identifying a failed memory element identifies said failed memory element while said integrated circuit is in a normal operational mode and said means for electrically activating said fusible elements activates said fusible elements while said integrated circuit is in a normal operational mode.

8. The integrated circuit of claim 5 wherein said integrated circuit includes a microprocessor.

9. The integrated circuit of claim 5 wherein said memory is of the DRAM type and wherein said means for recording records said locations of said failures while said integrated circuit is in a normal operational mode.

10. The integrated circuit of claim 5 wherein said redundancy element is selected from the group consisting of at least row redundancy element and column redundancy element.

* * * * *